(12) United States Patent
Bairanzade et al.

(10) Patent No.: US 8,306,035 B2
(45) Date of Patent: Nov. 6, 2012

(54) COMMUNICATION CIRCUIT AND METHOD THEREFOR

(75) Inventors: Michael Bairanzade, Tournefeuille (FR); Hassan Chaoui, Toulouse (FR); Pierre Andre Genest, Lafitte Vigordane (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1493 days.

(21) Appl. No.: 11/720,860

(22) PCT Filed: Jan. 23, 2006

(86) PCT No.: PCT/US2006/002359
§ 371 (c)(1),
(2), (4) Date: Jun. 5, 2007

(87) PCT Pub. No.: WO2007/084134
PCT Pub. Date: Jul. 26, 2007

(65) Prior Publication Data
US 2009/0225784 A1    Sep. 10, 2009

(51) Int. Cl.
*H04L 12/28* (2006.01)
(52) U.S. Cl. .................... 370/395.3; 370/476
(58) Field of Classification Search .............. 370/476, 370/395.3
See application file for complete search history.

(56) References Cited

U.S. PATENT DOCUMENTS

| | | | |
|---|---|---|---|
| 4,451,898 A * | 5/1984 | Palermo et al. | 710/29 |
| 6,426,954 B1 * | 7/2002 | Krause | 370/395.53 |
| 6,731,654 B1 * | 5/2004 | Champion et al. | 370/503 |
| 2001/0032334 A1 * | 10/2001 | Dapper et al. | 725/105 |
| 2002/0006136 A1 * | 1/2002 | Mallory et al. | 370/466 |
| 2003/0039269 A1 * | 2/2003 | Ala-Vannesluoma | 370/469 |
| 2005/0001812 A1 * | 1/2005 | Amundson et al. | 345/107 |

\* cited by examiner

*Primary Examiner* — Sai-Ming Chan
(74) *Attorney, Agent, or Firm* — Robert F. Hightower

(57) ABSTRACT

In one embodiment, a circuit is configured to operate with a communication protocol that has at least three different signal levels wherein different sequences of the three levels identify different elements of the communication protocol. In another embodiment, a modular control block may be used to select the communication protocol and the operation of the circuit.

19 Claims, 7 Drawing Sheets

US 8,306,035 B2

COMMUNICATION CIRCUIT AND METHOD THEREFOR

BACKGROUND OF THE INVENTION

The present invention relates, in general, to electronics, and more particularly, to methods of forming semiconductor devices and structure.

Previously, the electronics industry utilized various methods and structures to form data transmission between electronic circuits. In some applications, a single serial communication port was used to communicate between the various circuits. In some cases, the communication protocol required that the communication signal control the signal transitions within certain timing windows in order for the data within the signal to be recognized. Because the timing windows were synchronous, it was difficult for a receiver of the protocol to accurately synchronize to the timing windows of the transmitting circuit. Consequently, the data was often incorrectly identified by the receiving circuit. One such communication protocol is identified in U.S. Pat. No. 3,898,647 issued to Morra et al on Aug. 5, 1975.

Accordingly, it is desirable to have a communications protocol that can be easily identified by a receiving circuit, that is not synchronous, and that does not have synchronous timing windows for the transmitted signal.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
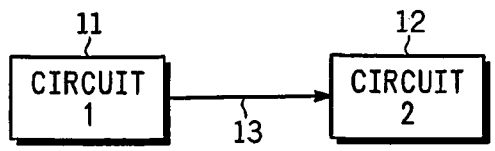
FIG. 1 schematically illustrates a block diagram of a communications system in accordance with the present invention.

FIG. 1 schematically illustrates a block diagram embodiment of a communications system 10 that utilizes a single communication line 13 to provide a communications path between a first circuit 11 and a second circuit 12. Single communication line 13 carries a communications signal between circuit 11 and circuit 12. The communications signal has a communication protocol as will be seen further hereinafter. Line 13 may have a physical implementation of any one of a variety of well-known configurations such as a wire conductor, fiber-optic cable, a radio frequency (RF) channel, or other well-known configuration.

Figure 2:
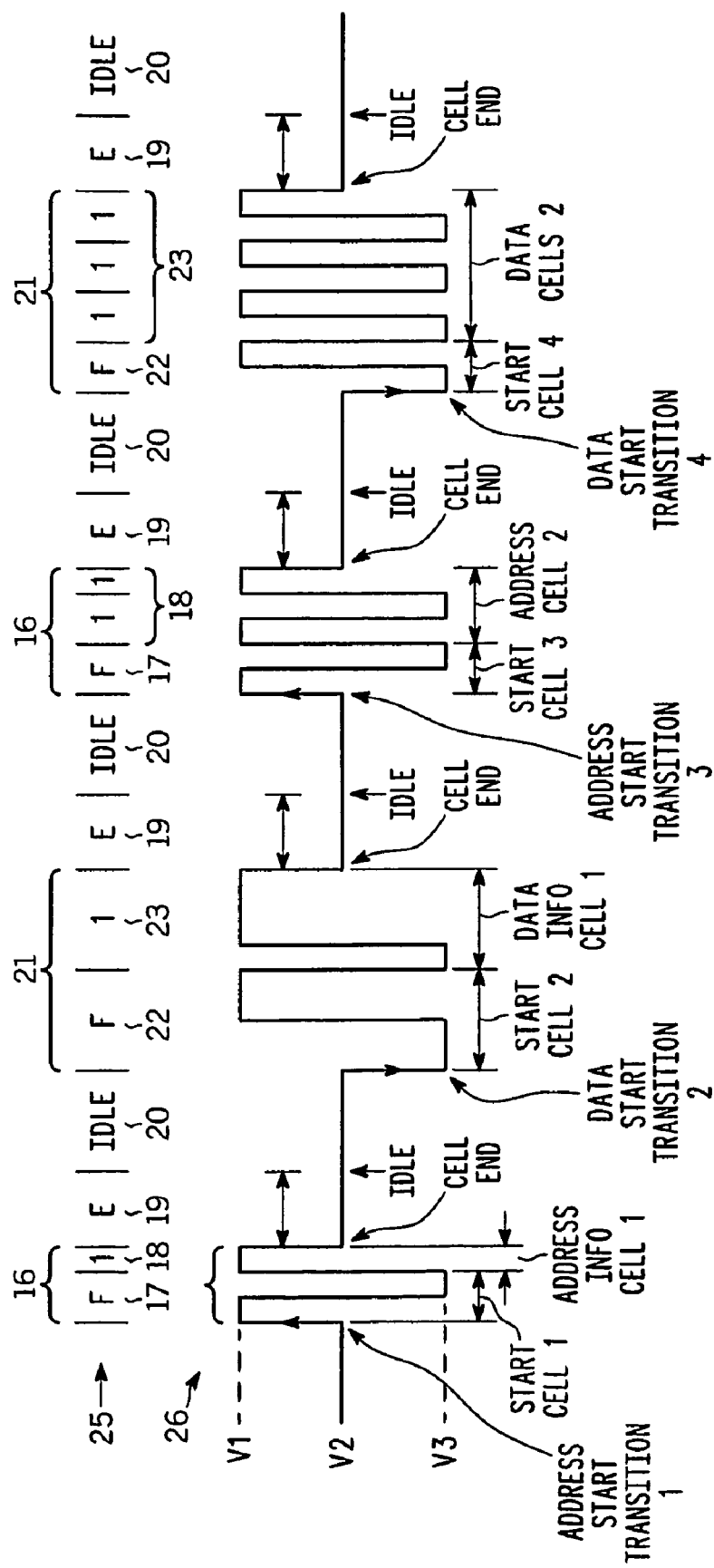
FIG. 2 schematically illustrates an embodiment of a portion of a communication protocol in accordance with the present invention.

FIG. 2 graphically illustrates an exemplary form of an embodiment of a portion of a communication protocol that may be used to transfer information between circuit 11 and circuit 12. A plot 26 graphically illustrates an exemplary embodiment of the signal levels of a communication signal that uses the communication protocol of FIG. 2. A plot 25 graphically illustrates a simplified frame format representation of the communication signal of plot 26. Plots 25 and 26 are identified in a general manner by arrows. The signal level of the communication signal forms a part of the communication protocol. The signal has three levels, a high level, a low level, and an intermediate level. A voltage, a current, or frequency modulation or any other different type of signal that can have the three signal levels may used for forming the communication signal. In the preferred embodiment, the signal is a voltage that has three voltage levels. The exemplary form of the communication protocol graphically illustrated in FIG. 2 is described using this preferred embodiment of a voltage for the type of signal. A first voltage level, illustrated by V1, is a high voltage value that represents the high level, a second voltage level V2 is a voltage value less than the voltage value of V1 and represents the intermediate level, and a third voltage level V3 is a lower voltage value that represents the low level of the signal that is lower than V1 and V2. For example, circuit 11 or 12 may be powered by a battery where V1 may represent a voltage close to the value of the battery voltage, V3 can represent a value close to a ground reference of the battery, and V2 could represent a voltage value approximately halfway between the value of V1 and V3.

The communication protocol typically has a plurality of different communication frame types within the communication protocol. As illustrated by plot 25, the communication protocol generally has a sequence of communication frames separated by an end identifier 19 and an idle identifier 20. Each communication frame usually includes a frame identifier (F) followed by frame information. The frame identifier (F) identifies the type of this communication frame among the plurality of communication frame types. In the preferred embodiment, the communication protocol has two types of communication frames, an address frame 16, and a data frame 21. End identifier 19 is identified by the communication signal returning to the intermediate value following either a high or a low level and signifies that the previous communication frame is complete. The communications signal must remain at the intermediate value a minimum amount of time, referred to as the inter-frame spacing, before a subsequent data frame may be transmitted or received. The time period of the inter-frame spacing typically depends on the system in which the communication protocol is used. The time of the inter-frame spacing can be almost any time that is supported by the logic delays of the system and especially the delays of the receiver circuit. The receiver circuit generally has delays that may limit the minimum value of the time. The maximum time generally does not have a limit. The time generally varies from about a few tenths of a nano-second to minutes or longer. The time preferably is about ten to one hundred (10-100) micro-seconds. Once the communication signal remains at the intermediate value for the inter-frame spacing time period subsequent to end identifier 19, the communications signal has formed idle identifier 20 and is in an idle state. The time period generally starts with the transition to end identifier 19. After idle identifier 20, another communication frame may be transmitted on the communication channel. A transition from the intermediate level (V2) to either a high level (V1) or to a low level (V3) subsequent to idle identifier 20 represents the beginning of a respective address frame 16 or a data frame 21.

Address frame 16 includes an address frame identifier 17 and address information 18. Address frame identifier 17 is identified by the communications signal transitioning to the high level (V1) after idle identifier 20. The transition to the high level (V1) is an address start transition of the address frame identifier. The address start transition is used to alert a receiving circuit that the communication channel is active. Address frame identifier 17 includes the intermediate to high transition, a high level for a period of time, a high to low transition, and a low level for a period of time. The subsequent high and low levels of the communications signal subsequent to address frame identifier 17 and prior to end identifier 19 represent address information 18. After address frame identifier 17, each high level following a low level, including the low level of identifier 17, represents a logical "1" of address information 18. The number of logical "1"s in address information 18 represents the address of the destination that is being addressed by the communication protocol. The number of logical "1"s is variable and can be any number as long as the highs are between address frame identifier 17 and end identifier 19. After address information 18, the communication signal returns to the intermediate value to form end identifier 19. End identifier 19 signifies that the communication of address frame 16 is complete. Once the communication signal remains at the intermediate value for the inter-frame spacing time period, the communications signal has formed idle identifier 20 and is in an idle state. After idle identifier 20, another communication frame, such as data frame 21, may be transmitted on the communication channel. The widths or time duration of the high levels and low levels of address frame identifier 17 and address information 18 are not synchronous, thus, are variable and can be any width. Preferably, the width is greater than a minimum width that can be supported by the propagation delays within the communications system.

Data frame 21 includes a data frame identifier 22 that is followed by data information 23. In most embodiments, data frame 21 follows address frame 16. Data frame identifier 22 is identified by the value of the communication signal transitioning to the low-level (V3) after idle identifier 20. The transition to the low level (V3) is a data start transition of the start of data frame 21. The data start transition is used to alert a receiving circuit that the communication channel is active. Data frame identifier 22 includes the intermediate to low transition, a low level for a period of time, a low to high transition, and a high level for a period of time. The subsequent high and low levels of the communications signal subsequently to data frame identifier 22 and prior to end identifier 19 represent data information 23. After data frame identifier 22, each high level following a low level represents a logical "1". The number of logical "1"s in data information 23 represents the information that is to be transferred to the destination. The number of logical "1"s is variable and can be any number as long as the highs are between data frame identifier 22 and end identifier 19. After data information 23, the communication signal returns to the intermediate value to form end identifier 19. End identifier 19 signifies that the communication of data frame 21 is complete. Once the communication signal remains at the intermediate value for the inter-frame spacing time period, the communications signal has formed idle identifier 20 and is in an idle state. After the inter-frame spacing, another communication frame may be transferred on the communication signal. The widths or time duration of the high levels and low levels of data frame identifier 22 and data information 23 are not synchronous, thus, are variable and can be any width. Preferably, the width is greater than a minimum width that can be supported by the propagation delays within the communications system.

Those skilled in the art will appreciate that in some embodiments the communication protocol may include other types of frames that are identified by an identifier similar to identifiers 17 and 22. In other embodiments a communication may include only one type of frame such as only a data frame or only an address frame, or may have one address frame followed by multiple data frames, or multiple address frames followed by one data frame. For example, the communication protocol may only have data and may not have an address frame. In such an example, the communication signal would vary between the three levels and the frame would start with a transition from V2 to either of V1 or V3, and the time duration of each high level or low level cell would still be variable. Additionally, the polarity of the signal polarity that forms address frame identifier 17 and data frame identifier 22 may be reversed.

For the exemplary embodiment of the communication signal by plot 26 and the frame format illustrated in plot 25, the first address frame has one high level following identifier 17, thus the address information is "1". The subsequent data frame has one high level following identifier 22, thus, the data information is "1". The second address frame has two high levels following identifier 17, thus the address information is "11" or "2". The second data frame has three high levels following identifier 22, thus, the data information is "111" or "3".

Figure 3:
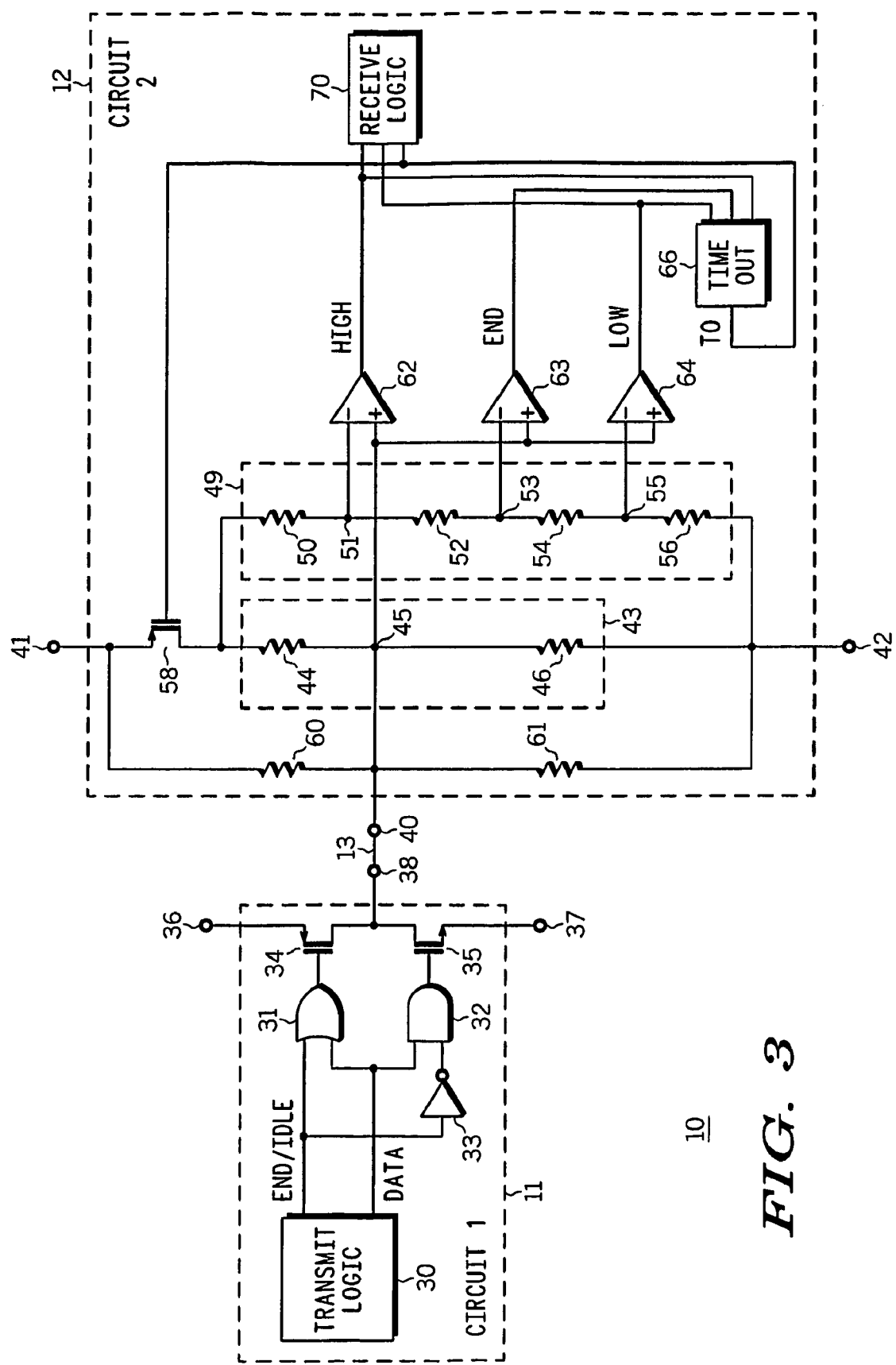
FIG. 3 schematically illustrates an embodiment of a portion of a transmitter circuit and a receiver circuit for the communications system of FIG. 1 in accordance with the present invention.

FIG. 3 schematically illustrates a portion of an embodiment of circuit 11 and circuit 12 that are described in the description of FIG. 1. Circuit 11 functions as a transmitter circuit and circuit 12 functions as a receiver circuit. Circuit 11 may include transmitter logic 30 that formats the data to be transmitted into a serial bit stream of the communication protocol. Logic 30 formats the data and adds the address frame identifier, the address frame information, the data frame identifier, and data frame information. Circuit 11 also generally includes transmitter elements including an OR gate 31, an AND gate 32, inverter 33, a P-channel MOS transistor 34 that is connected to receive an input voltage from a voltage input 36, and an N-channel transistor 35 that is connected to receive the input voltage from a voltage return 37. Transmit logic 30 deactivates the end/idle signal which allows logic 30 to transmit the address frame and data frame through gates 31 and 32 in order to switch transistors 34 and 35 and signal output 38 as defined by the communication protocol explained in the description of FIG. 2. After sending the address frame and data frame, logic 30 activates the end/idle signal to disable both transistors 34 and 35 to send the end identifier and idle identifier as defined by the communication protocol described in the description of FIG. 2.

Circuit 12 includes an intermediate level adjust circuit 43, a reference signal generator 49, a high level comparator 62, an intermediate level comparator 63, a low level comparator 64, a time out circuit 66, a power reduction switch implemented as a transistor 58, and receive logic 70. Circuit 12 receives the communication signal on an input 40. Resistors 44 and 46 along with transistor 58 form a switched voltage divider that receives an input voltage, between a voltage input 41 and a voltage return 42, and forms an intermediate voltage at a node 45. Resistors 60 and 61 are a voltage divider that receives the input voltage and also forms the intermediate voltage at a node 45. Reference generator 49 includes series connected resistors 50, 52, 54, and 56 that are connected in series between input 41 and return 42 to form three reference voltages having three successively lower voltage values. Comparator 62 compares the signal from circuit 11 to a high reference voltage formed at a node 51, comparator 63 compares the signal to an intermediate reference voltage formed at a node 53, and comparator 64 compares the signal to a low reference voltage formed at a node 55. If the signal is no less then the high reference voltage, the output of comparator 62 goes high. Similarly, if the signal is no greater than the low reference voltage the output of comparator 64 goes high. However, if the signal is approximately equal to the intermediate voltage, the output of comparator 63 goes high indicating detection of the end identifier at the end of an address frame or data frame. Time-out circuit 66 receives the high from comparator 63 and forms the delay that is approximately equal to the minimum inter-frame spacing of the communication protocol. After the timeout, the output of circuit 66 goes high. The high from circuit 66 disables transistor 58 thereby decoupling the resistors of circuit 43 and generator 49 from the input voltage in order to reduce the power dissipation of circuit 12. Resistors 60 and 61 remain connected to form a voltage divider to set the intermediate voltage when circuit 43 and generator 49 are disabled by transistor 58. The value of resistors 60 and 61 generally is large, for example about one meg-ohm or greater, to minimize the power dissipation of circuit 12. The output of circuit 66 remains high until the output of one of comparators 62 or 64 again goes high to signify receiving another start transition of another communication frame.

Those skilled in the art will appreciate that the protocol may have multiple high levels and multiple low levels as long as each high level is greater than the intermediate level and each low level is less than the intermediate level. Each high or low level could be detected by multiple comparators and corresponding voltage references.

Figure 4:
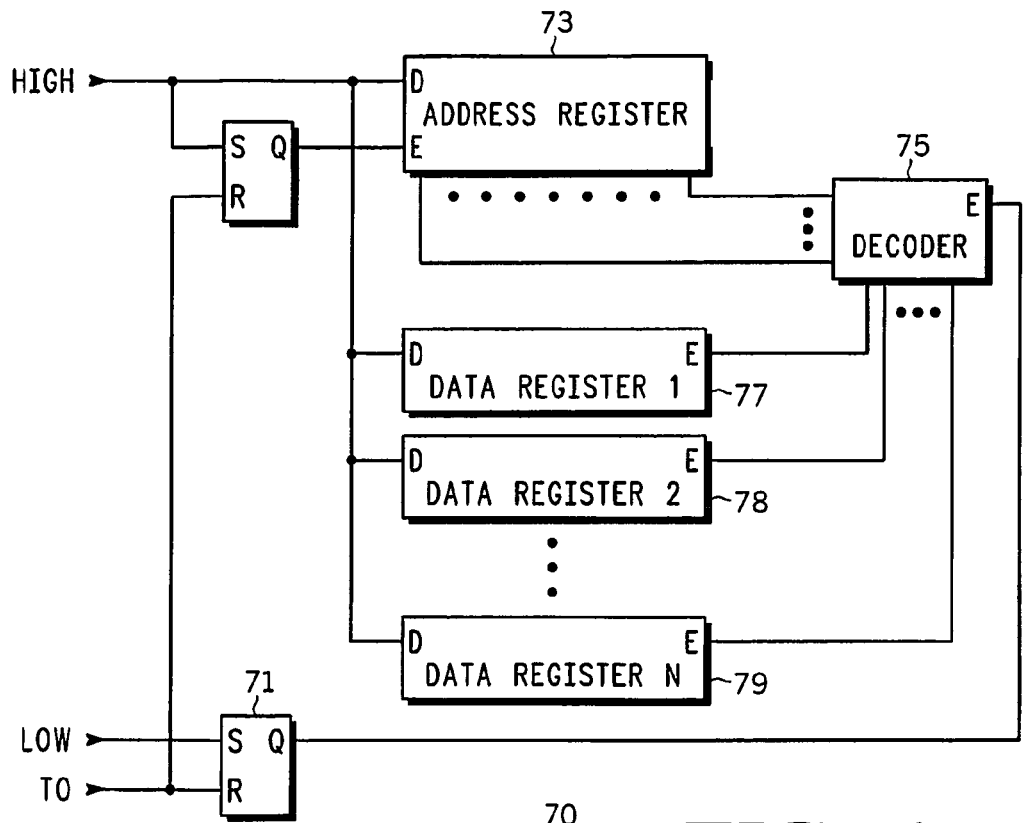
FIG. 4 schematically illustrates an embodiment of a portion of the receiver circuit of FIG. 3 in accordance with the present invention.

FIG. 4 schematically illustrates an exemplary embodiment of a portion of receive logic 70 that is described in the description of FIG. 3. Typically, a receiving circuit utilizes the information within address information 18 (FIG. 2) to identify a destination for data frame 21 (FIG. 2). For example, receiver circuit 12 may have a plurality of registers and the address information of address frame 16 may identify one register out of the plurality of registers which is to be the destination that receives the information within subsequent data frame 21. For the exemplary embodiment illustrated in FIG. 4, receive logic 70 includes a data mode latch 71, an address mode latch 72, an address register 73, an address decoder 75, and a plurality of data registers including a first data registered 77, a second data register 78, and an Nth data register 79. Mode latch 71 discriminates between the different types of frames of the incoming signal. Because the level of the frame identifier determines the type of frame following the frame identifier, the level of the frame identifier can be used to determine the mode for receive logic 70. If the frame identifier is high, comparators 62 and 64 force respective signals High and Low to respective states high and low. Previously, circuit 66 had forced the T0 signal high to reset latches 71 and 72. The high from comparator 62 resets circuit 66 which removes the high from the reset input of latches 71 and 72. Since latch 72 is a set dominant latch, the high from comparator 62 sets latch 72 which enables register 73. The subsequent high levels from comparator 62 are stored in register 73. After circuit 66 receives end identifier 19 and times the time-out, circuit 66 sets the T0 signal which resets latches 71 and 72. The low from latch 72 disables register 73 from storing subsequent information. If the next communication frame identifier is a low level, the frame is a data frame. The low-level forces the output of comparator 64 high. The high from comparator 64 resets circuit 66 which removes the high from the reset input of latches 71 and 72. Because latch 71 is a set dominant latch, the low from comparator 64 sets latch 71 independently of the state of the reset input of latch 61. The high from latch 71 enables decoder 75 to decode the information from register 73 and responsively enable one of data registers 77 through 79 to receive the information in the data frame. Latch 72 disables register 73 to prevent the information of the data frame from being stored in register 73. After the end identifier of the data frame, the output of circuit 66 again goes high to reset latches 71 and 72 and prepare receive logic 70 for the next communication frame. Those skilled in the art will appreciate that the exemplary embodiment illustrated in FIG. 4 is provided to help understand the subject matter of the application. The address frames and data frames may be used for other functions in addition to those described herein. For example, logic 70 may include other elements such as a counter to count the number of information bits that are received by logic 70. The result of the counting operation may be used for numerous subsequent actions such as inhibiting the storing of subsequent information bits.

In another embodiment, an edge detector circuit is connected to the output of each of comparators 62-64 to detect the output transitioning to a high level. As is well known in the art, an edge detector detects a transition of a signal and generates a pulse having a predetermined width. For example, a positive edge detector may detect a transition from a logic "0" to a logic "1" and generate a positive going pulse of a fixed duration. In this embodiment, the pulse output of the edge detector could be connected to receive logic 70 instead of connecting the output of comparators 62-64 directly to logic 70. For this embodiment, the pulses from the edge detector could be used as a clock for any or all of registers 73, 77, 78, or 79. The clock could clock a logic state into the registers.

Alternately, the value of the information in register 73 may be used for other functions. For example, the information in register 73 may be added to information in one of registers 77-79 as an offset to information stored in the register. In another embodiment, register 73 may be concatenated with one of registers 77-79 to form a longer register. For such an embodiment, register 73 may function as an index register that forms a portion of a larger register.

In one example embodiment, system 10 may be a camera system such as a camera for a cellular telephone. For such an embodiment, first circuit 11 may be a micro-processor that controls information and senses light conditions and second circuit 12 may represent a flash control circuit that is used to control the intensity of a flash used with the camera. One register of registers 77-79 could be assigned to hold intensity information for the flash. Thus the information stored in the register could be used to select the intensity of the flash between zero (no flash), or some number of increments (such as ten percent, or fifty percent, etc.), or a one hundred percent flash. The output of the register could be coupled to a flash element, not shown. The information stored within the register may be changed by circuit 11 through the communication protocol as described hereinbefore.

In yet another embodiment, that utilizes the edge detectors connected to the outputs of comparators 62-64, the pulses from the edge detectors, such as from the edge detector connected to comparator 62, can be counted by a counter and the value of the counter could be decoded to identify different control functions to be performed by other logic, not shown. One such control function could be to enable or disable a certain logic function.

Figure 5:
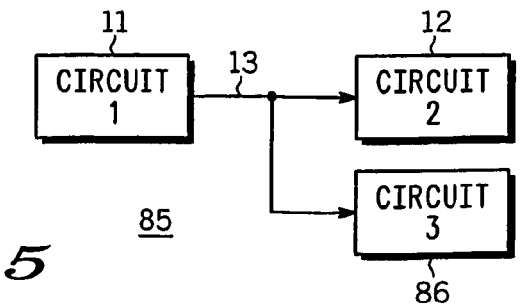
FIG. 5 schematically illustrates a block diagram of another communications system in accordance with the present invention.

FIG. 5 schematically illustrates a block diagram embodiment of a communications system 85 that is an alternate embodiment of system 10 illustrated in FIG. 1. System 85 utilizes a single communication line 13 and the communication protocol to provide a communications path from first circuit 11 to second circuit 12 and a third circuit 86. Single communication line 13 carries a communications signal between circuit 11 and circuit 12. Address information 18 of address frame 16 may be used to identify one semiconductor chip out of a plurality of semiconductor chips that may receive the information of subsequent data frame 21. For example, circuits 11, 12, and 86 may be micro-processors that communicate between each other using the communication protocol.

Figure 6:
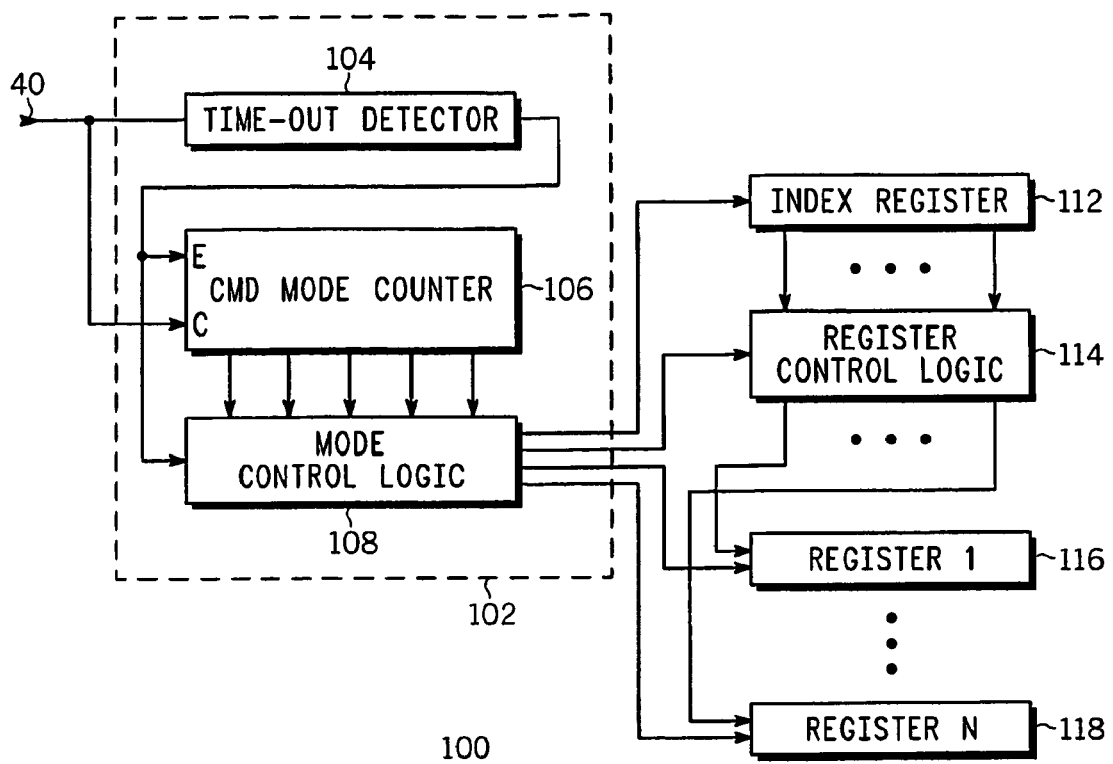
FIG. 6 schematically illustrates a block diagram of an embodiment of a portion of another receiver circuit for the communications system of FIG. 1 or FIG. 5 in accordance with the present invention.

FIG. 6 schematically illustrates a block diagram of an embodiment of a portion of a receiver circuit 100 that is an alternate embodiment of circuit 12 described in the description of FIG. 1 through FIG. 5. Receiver 100 includes a control block 102, an index register 112, a register control logic 114, and a plurality of data registers including a first register 116 through an Nth register 118. Although only two data resisters are illustrated, receiver 100 may have any number of data registers. Control block 102 receives an input signal from input 40 and responds to the transitions of the input signal. Those skilled in the art will appreciate that receiver 100 may receive an input signal such as a communication signal having the communication protocol described in the description of FIG. 2 through FIG. 5 or may use an alternate protocol such as a communication protocol that has positive and negative transitions. Examples of such an alternate protocol are illustrated hereinafter in FIG. 7 through FIG. 8. Control block 102 typically includes a time-out detector 104, a command (Cmd) mode counter 106, and mode control logic 108. Control block 102 receives the input signal and counts transitions of the input signal to determine the operating mode of receiver 100. The transitions of the input signal are counted by counter 106 until the communication signal is held at a high voltage level for a period of time that is greater than a minimum time period. The minimum time period is detected by time-out detector 104. Detector 104 creates a time-out signal on an output of detector 104 that indicates detection of the minimum time period or the time-out. The time-out signal disables counter 106. Mode control logic 108 receives the time-out signal and the count from counter 106 and responsively controls the operation of registers 112, 116, and 118. The information stored in index register 112 is often referred to as the number of the register or the address of the register that is operated on by the transitions of the input signal. Hereinafter, the information stored in register 112 may be referred to as the address of the register that is operated on. Using the contents of register 112 to select one of registers 116 through 118 is often referred to as register 112 pointing to one of registers 116 through 118.

In one embodiment, receiver 100 is formed on a semiconductor die that is assembled in a semiconductor package. In this embodiment, mode control logic 108 may be a replaceable control block that can be varied depending on the type of control that is desired for registers 112, 116, and 118. For example, different semiconductor die may have different versions of control logic 108. Thus, the way in which mode control logic 108 controls registers 112, 116, and 118 can be varied depending on the configuration of mode control logic 108.

Figure 7:
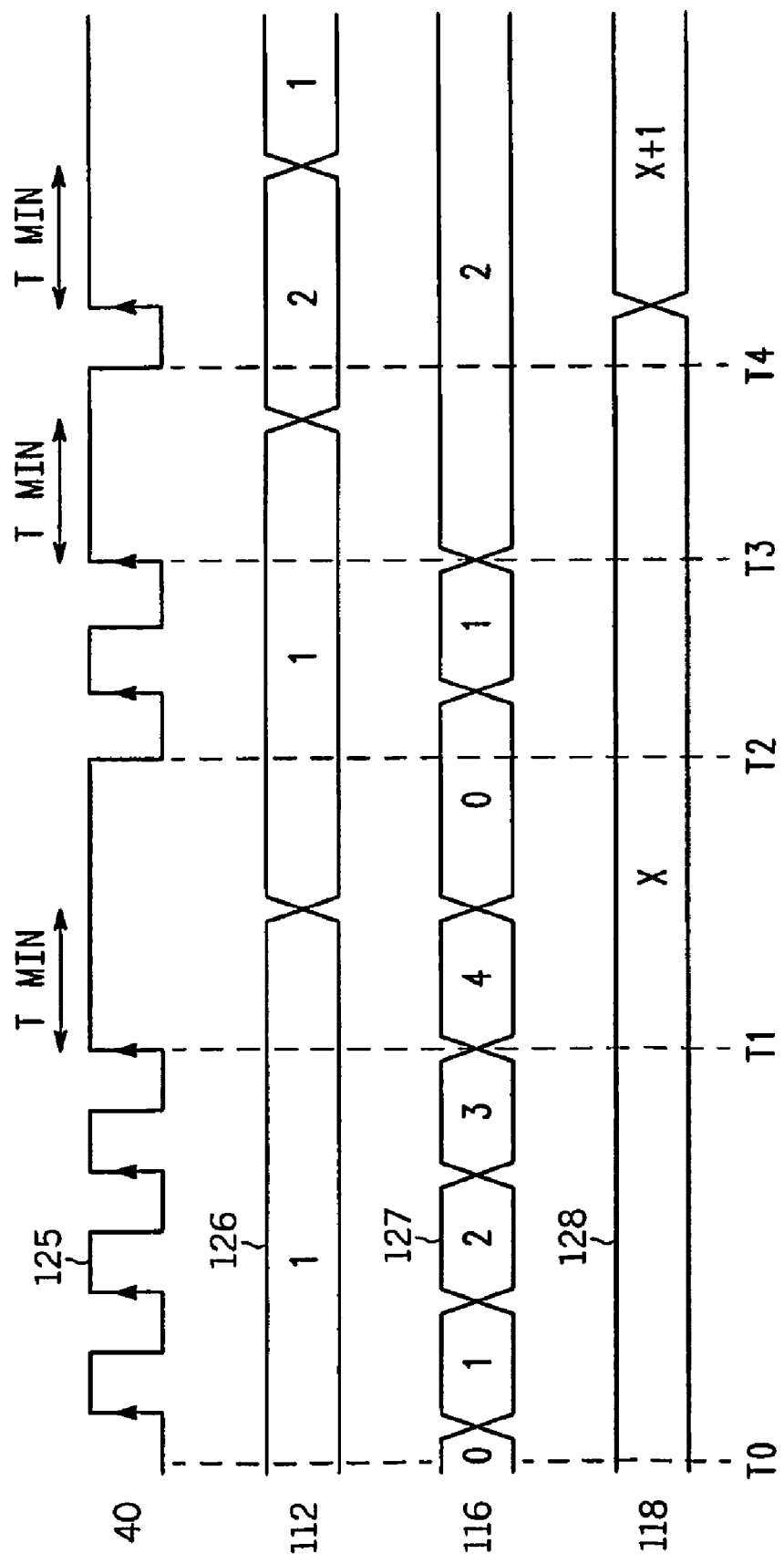
FIG. 7 is a graph having plots illustrating signals according to one exemplary embodiment of the receiver of FIG. 6 in accordance with the present invention.

FIG. 7 is a graph having plots illustrating some signals according to one exemplary embodiment of receiver 100 for one exemplary embodiment of mode control logic 108. A plot 125 illustrates the input signal on input 40. A plot 126 illustrates the operation of register 112, a plot 127 illustrates the operation of resistor 116, and a plot 128 illustrates the operation of register 118. This description has references to FIG. 6 and FIG. 7. For this exemplary embodiment, logic 108 is configured so that the number of pulses received on the input signal following the time-out period, or time-out, determines the operating mode of receiver 100. If the number of pulses is less than four (4), receiver 100 operates in a data mode and if the number of pulses is four or greater, receiver 100 operates in command mode. In the data mode, the register having the address that is stored within register 112 is incremented for each received pulse. After a time-out signal is received, register 112 is incremented. In the command mode, the register having the address that is stored within register 112 is incremented and the number of pulses counted by counter 106 determines the action that will be taken on registers 112, 116, and 118. If the number of transitions of the input signal is four, the register pointed to by register 112 is incremented four times and the number four is stored in counter 106. After receiving the time-out signal from detector 104, logic 108 sets the value stored within register 112 to the address of register 116 and then resets (clears) register 116. If the number of transitions of the input signal is five, the register pointed to by register 112 is incremented five times and the number five is stored in counter 106. After receiving the time-out signal from detector 104, logic 108 sets register 112 to the address of register 118 and resets (clears) register 118.

Assume for example that register 116 is cleared or reset prior to a time T0, that the contents of register 118 is unknown, and that register 112 contains the address of register 116. As receiver 100 receives pulses following a time-out period, command mode counter 106 counts the number of pulses. Additionally, mode control logic 108 and register control logic 114 use the value of index register 112 to determine which of registers 116 through 118 will be incremented (increments the register pointed to by register 112). Assume for example that register 112 has address one stored in it prior to time T0. Between times T0 and T1 the input signal has four rising edges. Since register 112 has address one and register 116 is register one, register 112 points to register 116 and register 116 is selected by logic 114. Thus, the input signal increments register 116 between times T0 and T1. After time T1, a time-out is received which causes mode control logic 108 to reset the register pointed to by register 112, or register 116, as illustrated between time T1 and a time T2. Since four pulses were received, control logic 108 sets register 112 to the address of register 116 which in this example is the number one. At time T2, receiver 100 begins receiving an input signal having two rising edges which increments register 116 to a count of two between time T2 and a time T3. After time T3, a time-out is received which causes mode control logic 108 to increment the address stored in register 112 from one to two. At time T4, receiver 100 begins receiving an input signal having one rising edge which increments register 118. Because the contents of register 118 was not known prior to time T4 (as illustrated by an X), the rising edge increments the contents of register 118. After time T4, a time-out is received which causes mode control logic 108 to increment the register pointed to by register 112 which at this time is register 118. Those skilled in the art will appreciate that the contents of register 116 could be a value other than zero at time T0 and will also appreciate that registers 112, 116, and 118 could be set to values other than zero by the command and data modes.

Figure 8:
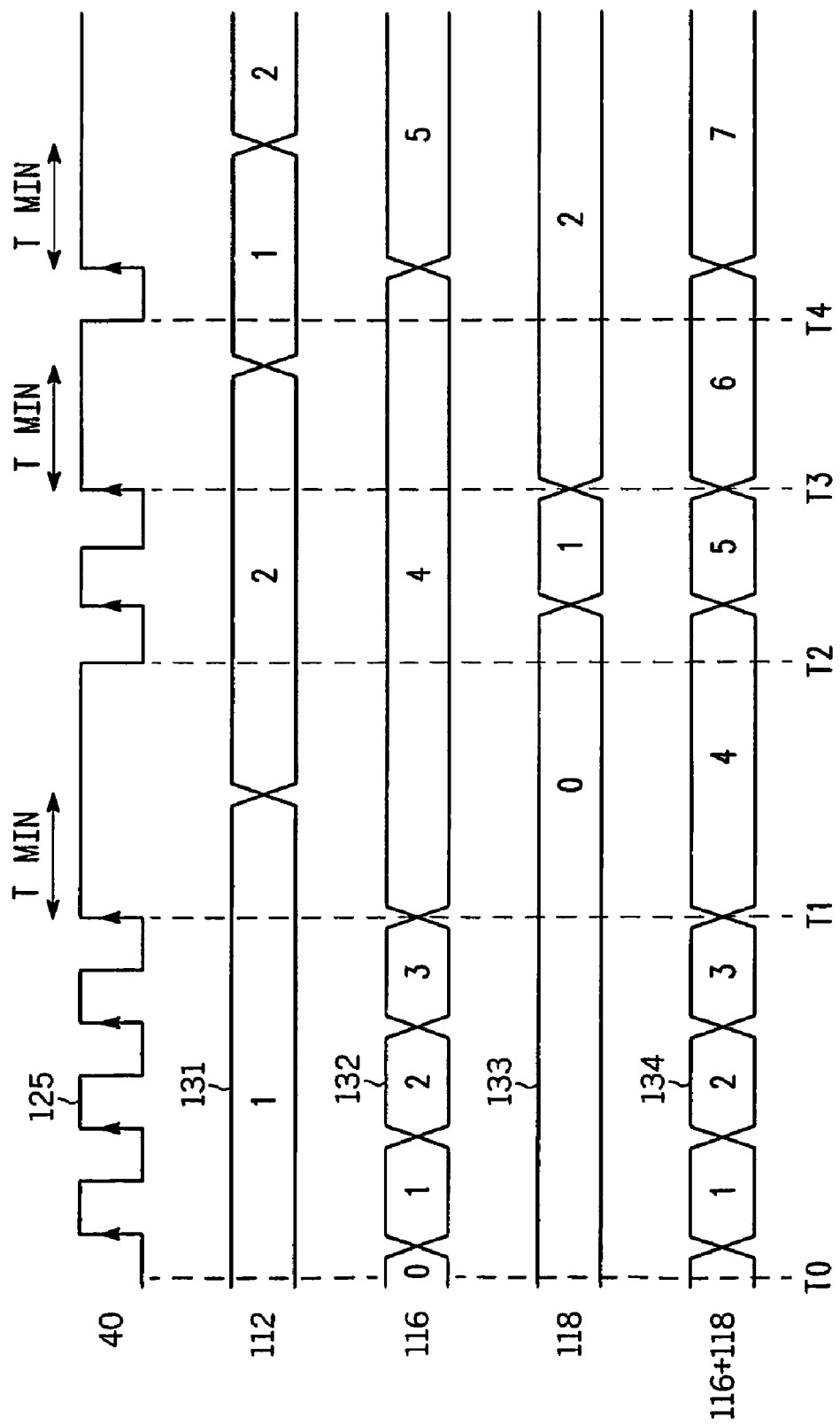
FIG. 8 is a graph having plots illustrating signals according to a second exemplary embodiment of the receiver of FIG. 6 in accordance with the present invention.

FIG. 8 is a graph having plots illustrating some signals according to a second exemplary embodiment of receiver 100 having a different exemplary embodiment of mode control logic 108. A plot 131 illustrates the contents of register 112, a plot 132 illustrates the contents of register 116, a plot 133 illustrates the contents of register 118, and a plot 134 illustrates a sum of the contents of registers 116 and 118. This description has references to both FIG. 6 and FIG. 8. For this exemplary embodiment, the contents of register 112 are incremented after detector 104 detects a time-out period. In this exemplary embodiment, only one mode is used, thus, the command mode is not used and control of the registers is accomplished differently. Assume for example that registers 116 and 118 are cleared or reset prior to a time T0 and that register 112 contains the address of register 116. Since register 112 points to register 116, the input signal received between time T0 and a time T1 increments register 116 to a count of four. At time T1 a time-out occurs. At the end of the time-out, register 116 is not changed but logic 108 increments the contents of register 112. Since there are only two data registers in this example, register 112 is incremented to two which is the address of register 118. At a time T2, the input signal begins incrementing register 118 until a time-out occurs after a time T3. After the time-out period, register 118 is not changed but logic 108 increments register 112 causing register 112 to roll-over to the address of register 116. The input signal received at time T4 increments register 116 from four to five. Consequently, the sum of registers 116 and 118 begins at one and increments of each rising edge of the input signal.

Figure 9:
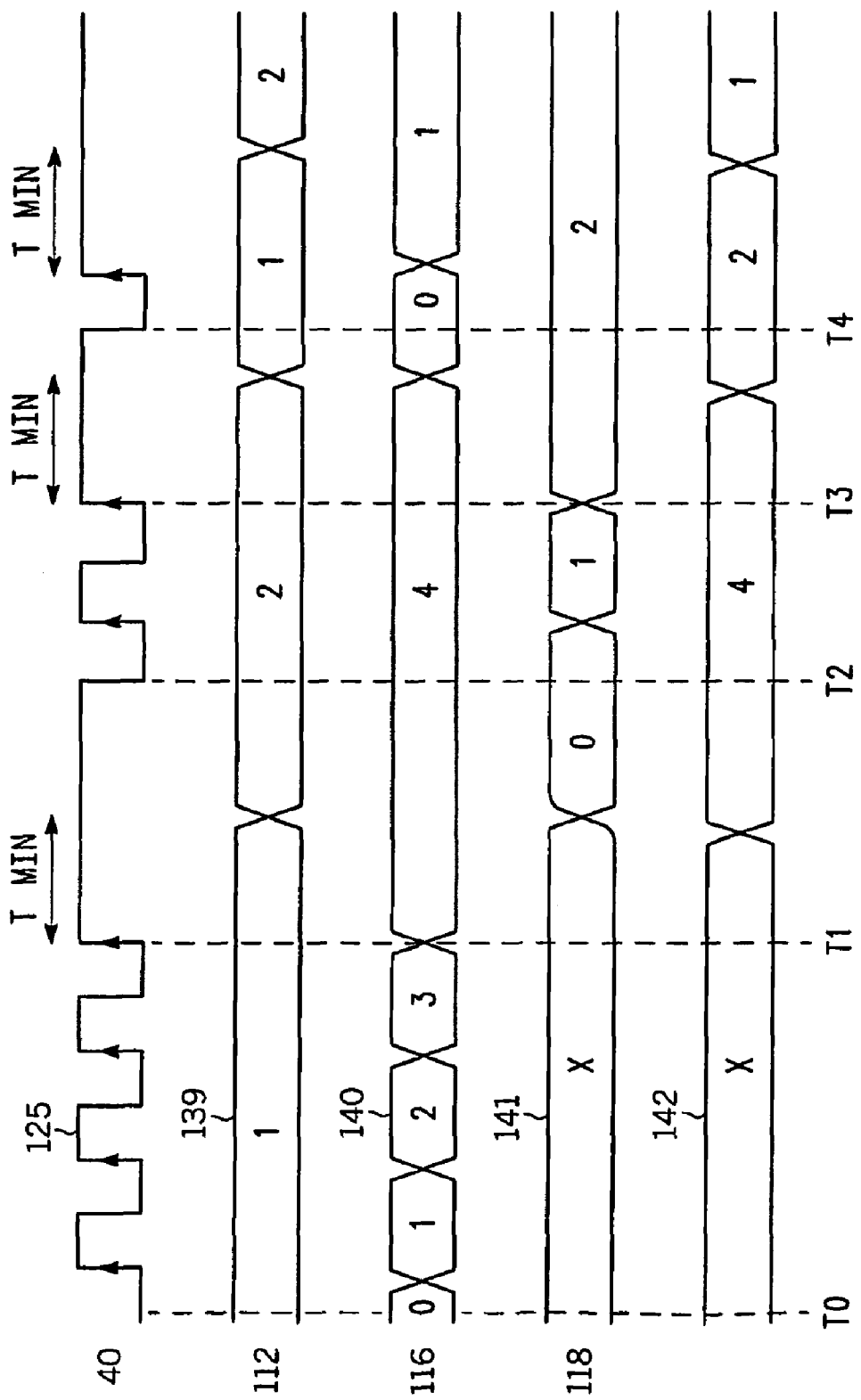
FIG. 9 is a graph having plots illustrating signals according to a third exemplary embodiment of the receiver of FIG. 6 in accordance with the present invention.

FIG. 9 is a graph having plots of some signals of a third exemplary embodiment of receiver 100 that has a third embodiment of mode control logic 108. A plot 139 illustrates the contents of register 112, a plot 140 illustrates the contents of register 116, a plot 141 illustrates the contents of register 118, and a plot 142 illustrates an exemplary application for the information within registers 112, 116, and 118. This description has references to both FIG. 6 and FIG. 9. For this exemplary embodiment of receiver 100, the contents of register 112 are incremented after detector 104 detects a time-out and the register pointed to by register 112 is reset. Assume for example that register 112 has the address of register 116, that register 116 is reset, and that the contents of register 118 are unknown prior to a time T0. Between time T0 and a time T1, the input signal increments register 116 to four. After time T1, a time-out occurs. At the end of the time-out, logic 108 increments register 112 to the address of register 118. Logic 108 also resets the register pointed to by register 112 which in at this time is register 118 so that register 118 begins counting from zero. The input signal received between times T2 and T3 increments register 118 to two as illustrated by plot 141. At the end of the next time-out period that occurs after time T3, logic 108 increments register 112 which rolls over to the address of resistor 116 and logic 108 resets register 116. Consequently, register 116 begins counting from zero to one at a time T4.

In one example embodiment, receiver 100 may be used to control the intensity of a light from a light emitting diode (LED) that is used as a flash element of a digital camera. The contents of registers 112, 116, and 118 may be used to control the intensity of light emitted by the LED. For example, each set of pulses from input 40 may be used for the intensity of one flash action. For such a flash action, the contents of the register pointed to by register 112 may be used to control the intensity of that particular flash action. Just before the end of the time-out, the contents of the register pointed to by register 112 may be stored in a storage element and that data may be used to control the intensity of light emitted by the LED. This data is illustrated by plot 142.

As can be seen, using a modular design for mode control logic 108 allows receiver 100 to have many different operating modes that may be changed by changing logic 108. For example, logic 108 may be designed to operate in several different modes and one of the modes from the group of modes may be selected by bonding options of the semiconductor die or by the state of pins on the package that contains the semiconductor die on which receiver 100 is formed.

Figure 10:
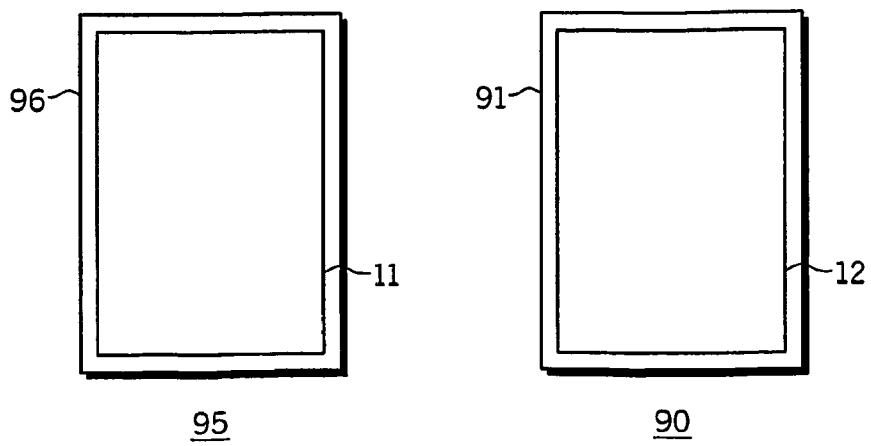
FIG. 10 schematically illustrates an enlarged plan view of a semiconductor device that includes the transmitter circuit of FIG. 3 and an enlarged plan view of another semiconductor device that includes the receiver circuit of FIG. 3 in accordance with the present invention.

FIG. 10 schematically illustrates an enlarged plan view of a portion of an embodiment of a semiconductor device 90 that is formed on a semiconductor die 91 and a semiconductor device 95 that is formed on a semiconductor die 96. Circuit 11 is formed on die 96 and circuit 12 is formed on die 91. Dice 91 and 96 may also include other circuits that are not shown in FIG. 10 for simplicity of the drawing. Circuit 11 and device 95 are formed on die 96 by semiconductor manufacturing techniques that are well known to those skilled in the art. Circuit 12 and device 90 are formed on die 91 by semiconductor manufacturing techniques that are well known to those skilled in the art In view of all of the above, it is evident that a novel communication method and circuit for using the protocol is disclosed. Included, among other features, is forming the protocol to have three different levels to the communication signal. The three different levels facilitate forming the protocol to be non-synchronous there by allowing the width of each level to vary. The variable width ensures that the logical state of the signal, determined from the high or low level of the signal, is not time dependent. Thus, the step of determining the information represented by the signal does not depend on the time that the signal is at the level, thus, is not time dependent. The variable width improves the accuracy of the data transmissions and reduces the complexity of the circuits used to implement the protocol. The reduced complexity reduces the costs.

While the subject matter of the invention is described with specific preferred embodiments, it is evident that many alternatives and variations will be apparent to those skilled in the semiconductor arts. More specifically the subject matter of the invention has been described for a particular signal level representing the information of the frames. Those skilled in the art will appreciate that both the high signal level and the low signal level may be used to represent information for the frames.

The invention claimed is:

1. A communication circuit comprising:
   the communication circuit having a receiver circuit having an input configured to receive a communication signal, the communication signal having a communication protocol that has a first signal level, a second signal level that is less than the first signal level, and a third signal level that is less than the second signal level; and
   the communication protocol having at least two different types of communication frames wherein each communication frame has a frame identifier that specifies a type of communication frame followed by an information cell having information for the communication frame wherein a time duration of the information cell is not synchronous and is variable and wherein a first communication frame identifier includes a signal having one of the first signal level or the third signal level subsequent to having the second signal level and wherein a second communication frame identifier always includes a signal having a signal level that is the other one of the first or third signal level subsequent to having the second signal level.

2. The communication circuit of claim 1 wherein the information for the communication frame has a variable number of information cells.

3. The communication circuit of claim 1 wherein the second signal level is approximately half way between a value of an input voltage to the communication system and a return voltage of the communication system.

4. The communication circuit of claim 1 wherein the second signal level is approximately half way between the first signal level and the third signal level.

5. The communication circuit of claim 1 wherein a time that the signal is at either of the first signal level or the second signal level for an information cell is variable.

6. The communication circuit of claim 1 wherein a logical state of the signal is not time dependent.

7. The communication circuit of claim 1 wherein the two different types of communication frames include an address frame wherein the information for the address frame represents an address of a receiving circuit.

8. The communication circuit of claim 7 wherein the information for the address frame represents an address of a control circuit within the receiving circuit.

9. The communication circuit of claim 1 wherein the communication protocol includes a first type of communication frame of the two different types of communication frames followed by a second type of communication frame of the two different types of communication frames.

10. The communication circuit of claim 9 wherein an interframe spacing separates the first type of communication frame from the second type of communication frame.

11. A method of forming a communication circuit comprising:
    configuring the communication circuit to receive a communications protocol having a signal that has a first signal level, a second signal level that is a lower level that the first signal level, and a third signal level that is a lower level that the second signal level;
    configuring the communication circuit to use a first occurrence of the first signal level after an occurrence of the second signal level as an identifier of a first frame type wherein subsequent occurrences of the first signal level or the third signal level prior to an occurrence of the second signal level represent information for the first frame type; and
    configuring the communication circuit to use a first occurrence of the third signal level after an occurrence of the second signal level as an identifier of a second frame type wherein subsequent occurrences of the first signal level or the third signal level prior to an occurrence of the second signal level represent information for the second frame type.

12. The method of claim 11 further including configuring the communication circuit to use the second signal level as an end of both the first frame type and the second frame type.

13. The method of claim 12 wherein configuring the communication circuit to use the first occurrence of the first signal level after the occurrence of the second level signal includes configuring the communication circuit to use the first occurrence of the first signal level after the occurrence of the second signal level to represent a destination for the second frame type.

14. The method of claim 13 includes configuring the communication circuit to use the information for the second frame type as data for the destination.

15. The method of claim 11 wherein configuring the communication circuit to use the first occurrence of the first signal level after the occurrence of the second signal level includes configuring the communication circuit to use the first occurrence of the first signal level after the occurrence of the second signal level to represent a destination that is one of a register of a receiving circuit or one circuit of a plurality of circuits.

16. A communication circuit comprising:
    a semiconductor device configured to operate with a communication protocol having a first signal level, a second signal level that is less than the first signal level, and a third signal level that is less than the second signal level; and
    the communication protocol having a communication frame that includes a frame identifier and frame information, the communication protocol using a first occurrence of the first or third signal level after an occurrence of the second signal level as an identifier of a frame type and wherein the frame information includes at least one of either the first signal level or the third signal level for a first time period following an occurrence of the second signal level and wherein the first time period is variable.

17. The communication circuit of claim 16 wherein the frame information includes, for a second time period, at least one of either the first signal level or the third signal level wherein the second time period is variable.

18. A communication circuit comprising:
    a semiconductor device configured to receive a communication signal on a single input of the semiconductor device, the semiconductor device having a communication receiver circuit that includes a control block wherein the control block is replaceable to accept different communication protocols and to control operation of the communication receiver circuit to responsively to the communication protocol; and
    the communication protocol having an address frame and a data frame and a time-out period between transitions of the address and date frames wherein the control block sets an operating mode of the communication receiver circuit after the time-out period and wherein the time-out period is variable.

19. The method of claim 11 further including configuring the communication circuit to receive the signal wherein the signal is devoid of the second signal level for multiple occurrences of the first or third signal level after the first occurrence of the first or third signal level.

* * * * *